United States Patent
Lim et al.

(10) Patent No.: US 8,030,742 B2
(45) Date of Patent: Oct. 4, 2011

(54) ELECTRONIC DEVICE HAVING PROFILED ELEMENTS EXTENDING FROM PLANAR SURFACES

(75) Inventors: Boon Kian Lim, Melaka (MY); Yang Hong Heng, Johor (MY)

(73) Assignee: Infineon Technologies, Neubiberg (DE)

( * ) Notice: Subject to any disclaimer, the term of this patent is extended or adjusted under 35 U.S.C. 154(b) by 351 days.

(21) Appl. No.: 11/948,549

(22) Filed: Nov. 30, 2007

(65) Prior Publication Data
US 2009/0140403 A1   Jun. 4, 2009

(51) Int. Cl.
*H01L 23/495* (2006.01)
(52) U.S. Cl. .................. 257/676; 257/666; 257/E23.031
(58) Field of Classification Search .................. 257/676, 257/666, E23.031
See application file for complete search history.

(56) References Cited

U.S. PATENT DOCUMENTS

| | | | |
|---|---|---|---|
| 5,041,902 A * | 8/1991 | McShane | 257/706 |
| 5,328,870 A | 7/1994 | Marrs | |
| 5,381,042 A | 1/1995 | Lerner et al. | |
| 5,990,554 A | 11/1999 | Golubic et al. | |
| 2002/0074147 A1 | 6/2002 | Tan et al. | |
| 2005/0258521 A1 * | 11/2005 | Park et al. | 257/670 |
| 2005/0260795 A1 | 11/2005 | Park et al. | |
| 2006/0220187 A1 | 10/2006 | Elliott et al. | |
| 2009/0039486 A1 * | 2/2009 | Shimazaki et al. | 257/676 |

* cited by examiner

*Primary Examiner* — Phat Cao
(74) *Attorney, Agent, or Firm* — Dicke, Billig & Czaja, PLLC

(57) ABSTRACT

Embodiments provide an electronic device including a leadframe, a chip attached to the leadframe, and encapsulation material disposed over a portion of the leadframe. The leadframe includes a first main face opposite a second main face and a plurality of edges extending between the first and second main faces. At least one of the plurality of edges includes a first profiled element and a second profiled element different than the first profiled element. The encapsulation material is disposed over the chip and the plurality of edges of the leadframe.

18 Claims, 6 Drawing Sheets

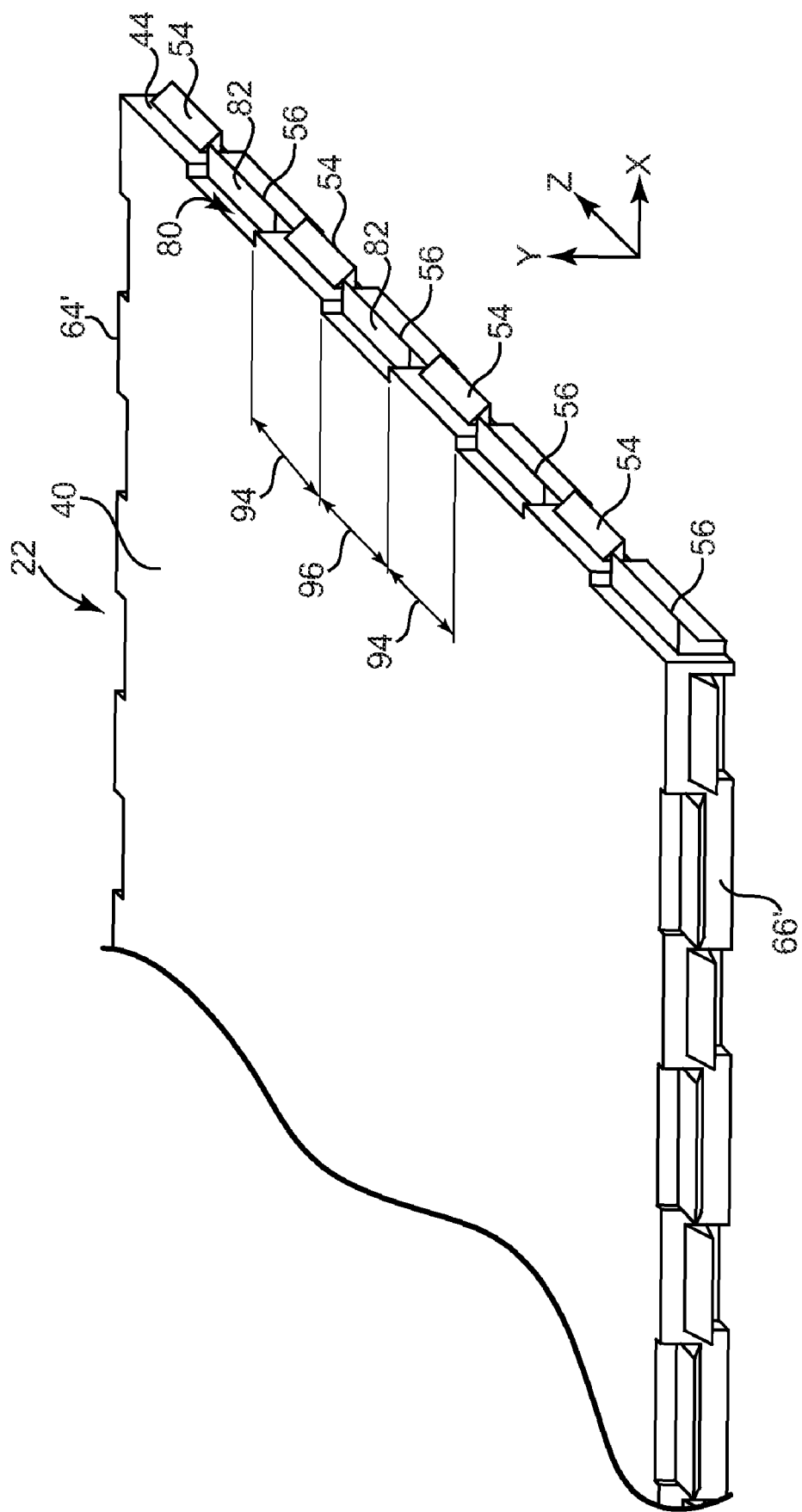

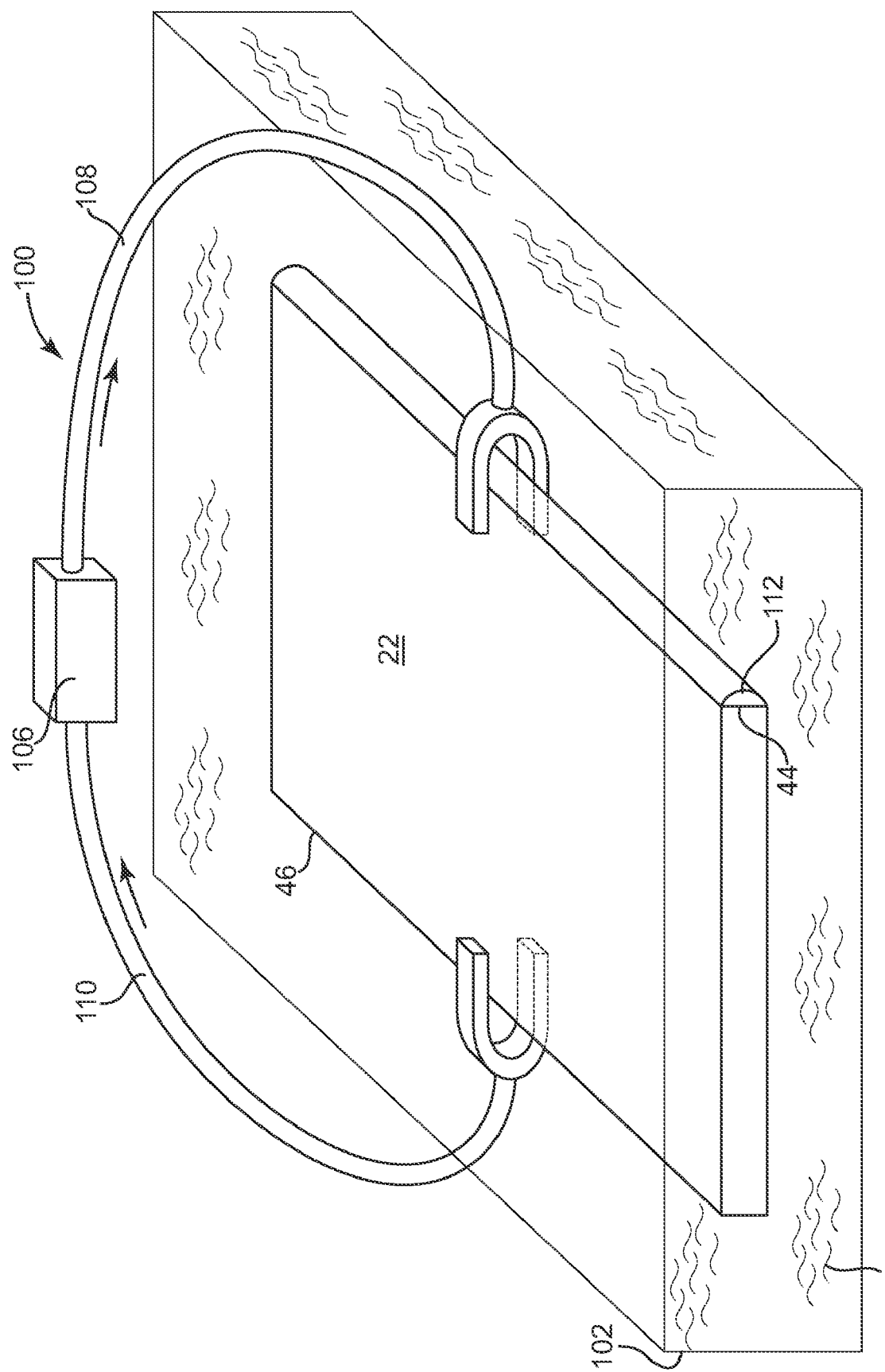

ELECTRONIC DEVICE HAVING PROFILED ELEMENTS EXTENDING FROM PLANAR SURFACES

BACKGROUND

Semiconductor packages provide environmental protection to integrated circuit chips enclosed within the package. Semiconductor packages include a supporting leadframe, one or more chips attached to the leadframe, encapsulating material molded over the leadframe and the chip(s), and multiple leads configured to electrically connect the chip to the "outside" world.

The leadframe supports the chip, and the encapsulation material shelters the chip(s) from the environment. During use, the chip can increase in temperature. The increase in temperature during use, and the subsequent cooling of the chip when not in use, causes thermal cycling of the chip and the package. In general, the chip, the leadframe, and the encapsulation material each have a different coefficient of thermal expansion (CTE). The differing CTE for the components of the package has the potential to delaminate the leadframe from the encapsulation material during thermal cycling. Delaminated leadframes potentially interrupt the electrical connection to the chip and between the chip and the outside world, which is undesirable for both the package manufacturer and the end-user of the package.

For these and other reasons there is a need for the present invention.

SUMMARY

One aspect provides an electronic device including a leadframe, a chip attached to the leadframe, and encapsulation material disposed over a portion of the leadframe. The leadframe includes a first main face opposite a second main face and a plurality of edges extending between the first and second main faces. At least one of the plurality of edges includes a first profiled element and a second profiled element different than the first profiled element. The encapsulation material is disposed over the chip and the plurality of edges of the leadframe.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 4 is a perspective view of a leadframe having a multi-axis mold lock profile according to one embodiment.

FIG. 5 is a perspective view of a process for depositing mold lock material on a side of a leadframe according to one embodiment.

DETAILED DESCRIPTION

Figure 1:
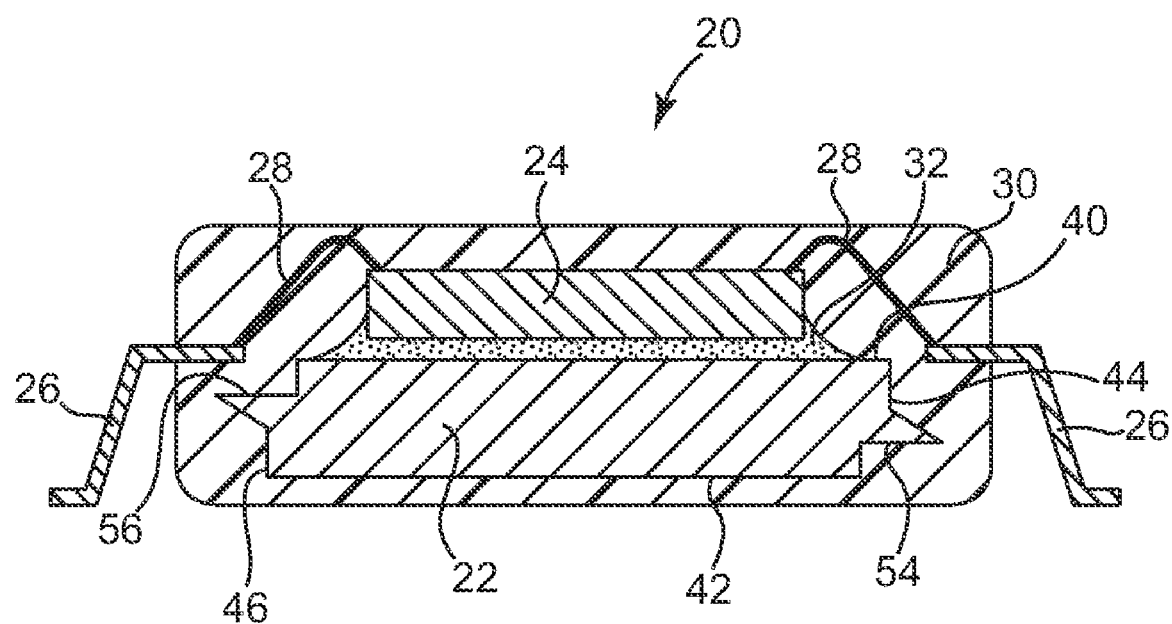
FIG. 1 is a cross-sectional view of an electronic device including a leadframe having a multi-axis mold lock profile according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. As employed in this Specification, the term "electrically coupled" does not mean that the elements must be directly coupled together; intervening elements may be provided between the "electrically coupled" elements.

Embodiments provide a leadframe suitable for use in a semiconductor package including a multi-axis mold lock profile that provides improved and stronger anchoring between the leadframe and encapsulation material covering the leadframe. Embodiments provide one, or two, or more edges of a leadframe that are each profiled to include a first mold lock structure and a second mold lock structure that is different than the first mold lock structure. In some embodiments, the structure elements of the profiled mold lock alternate in an A-B-A-B-A fashion along a peripheral edge of the leadframe. In one embodiment, multiple first and second profiled mold locks are provided on at least one edge of the leadframe. In another embodiment, multiple first and second profiled mold locks are provided on at least two opposing edges of the leadframe. The mold locks include alternating first and second profiled mold locks; spaced first and second mold locks; and multiple first profiled structured mold locks adjacent to multiple profiled second structure mold locks.

Embodiments provide leadframes and/or heatsinks having a profiled edge that is configured to minimize movement of the leadframe/heatsink during thermal cycling of the chip. In one embodiment, the leadframe includes first and second structure elements that engage with encapsulation material to minimize movement of the leadframe in planes parallel and normal to the leadframe. In this manner, de-lamination of the leadframe/heatsink relative to the encapsulation material is minimized. The leadframe/heatsink is provided with multiple axes of locking structures that minimize movement of the leadframe normal to the leadframe and minimize movement of the leadframe in a plane parallel to the leadframe.

FIG. 1 is a cross-sectional view of an electronic device 20 according to one embodiment. Electronic device 20 includes a leadframe 22, a chip 24 attached to leadframe 22, leads 26 electrically connected to chip 24 by connectors 28, and encapsulation material 30 disposed over leadframe 22, chip 24, and a portion of leads 26.

Chip 24 includes semiconductor chips in general, memory and/or logic chips, integrated circuits having vertical power transistors, or any chips suitable for use in a semiconductor package. In one embodiment, chip 24 is attached to leadframe 22 by an electrically insulating adhesive material 32. In other embodiments, material 32 includes pastes, epoxies, including conductive pastes and epoxies, or other suitable attachment material. In one embodiment, chip 24 is soldered to leadframe 22.

In one embodiment, leads 26 include conductive leads. Suitable materials for leads 26 include copper, alloys of copper, and other conductive materials. In one embodiment, leads 26 are copper leads that include a coating (not shown) configured to minimize oxidative degradation of the copper leads 26.

In one embodiment, connectors 28 include wire connectors such as gold wire connectors, silver wire connectors, copper wire connectors, or other conductive connectors configured to electrically couple chip 24 to leads 26.

In one embodiment, encapsulation material 30 includes epoxy, cross-linked or cross-linkable polymer, plastic, resin, or other electrically insulating material suited for molding over chip 24 to define an exterior surface of package/device 20.

In one embodiment, leadframe 22 enables electrical connection between chip 24 and the outside world. In one embodiment, leadframe 22 is a heatsink configured to have a sufficient mass (e.g., thickness) to provide an integral heat dissipater adapted to dissipate heat generated by chip 24. In another embodiment, leadframe 22 includes a heatsink (not shown) separately attached to a face of leadframe 22 opposite of chip 24.

In one embodiment, leadframe 22 includes a first main face 40 opposite a second main face 42, a first lateral edge 44 extending between faces 40, 42, a second lateral edge 46 extending between faces 40, 42, a first profiled element 54 extending from first lateral edge 44, and a second profiled element 56 extending from second lateral edge 46. Although not visible in the cross-sectional view of FIG. 1, one embodiment provides first profiled element 54 and second profiled element 56 each extending from first lateral edge 44 (best shown in FIGS. 2 and 4).

In one embodiment, first and second profiled elements 54, 56 are different and first profiled element 54 defines a flat or land that faces away from chip 24, where second profiled element 56 defines a flat or land that faces toward chip 24 and in the direction of first main face 40. In one embodiment, first profiled element 54 is different from second profiled element 56, at least in relative orientation or physical structure, and each profiled element 54, 56 is oriented to have a land facing in opposing directions.

In one embodiment, leadframe 22 is formed from copper and profiled elements 54, 56 are stamped into edges 44, 46, respectively, of leadframe 22. In another embodiment, leadframe 22 is a metal leadframe and profiled elements 54, 56 are etched out of faces 42, 40, respectively, of leadframe 22. In another embodiment, leadframe 22 is a metal leadframe and profiled elements 54, 56 are grown (for example, galvanically grown) onto respective edges 44, 46 as described below. Profiled elements 54, 56 include other suitable profiled structures formed into or onto one or more edges 44, 46 of leadframe 22. In one embodiment, profiled elements 54, 56 are formed on any suitable edge of leadframe 22.

Figure 2:
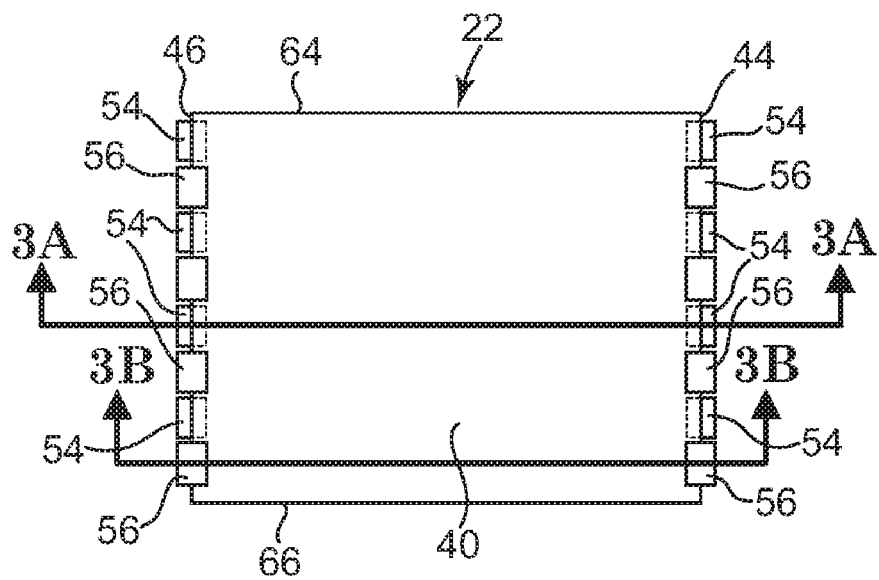
FIG. 2 is a top view of the leadframe shown in FIG. 1.

FIG. 2 is a top view of first main face 40 of leadframe 22. In one embodiment, first lateral edge 44 includes first sections of first profiled elements 54 and second sections of second profiled elements 56, and second lateral edge 46 also includes first sections of first profiled elements 54 and second sections of second profiled elements 56.

Although the pattern of first and second profiled elements 54, 56 is illustrated as being the same for edges 44, 46, other embodiments provide for a different pattern of first and second profiled elements 54, 56 on edge 44 as compared to edge 46.

In one embodiment, leadframe 22 includes a first longitudinal edge 64 opposite a second longitudinal edge 66, and one or both of longitudinal edges 64, 66 are structured to include first profiled elements 54 and second profiled elements 56 in a manner similar to that described for sides 44, 46. The pattern of profiled elements 54, 56 include elements structured into one or both of longitudinal edges 64, 66, and the structured pattern can be the same, or different, between longitudinal edges 64, 66.

In one embodiment, first lateral edge 44 includes alternating first and second profiled elements 54, 56, and second lateral edge 46 includes alternating first and second profiled elements 54, 56.

Figure 3A:
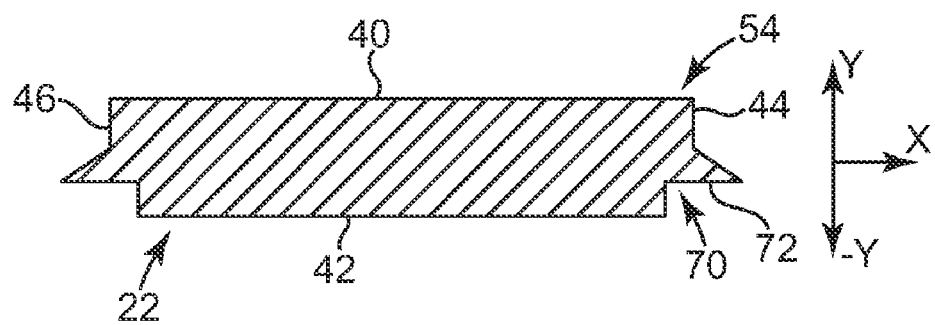
FIG. 3A is a cross-sectional view of the leadframe shown in FIG. 2 taken along line 3A-3A.

FIG. 3A is a cross-sectional view of leadframe 22 taken through line 3A-3A of FIG. 2. In one embodiment, first lateral edge 44 and second lateral edge 46 each include a first profiled element 54 that defines a shoulder 70 recessed relative to second main face 42. In one embodiment, a stamping device or other tool is employed to stamp shoulder 70 into second main face 42 and define first profiled element 54 projecting from first lateral edge 44. In one embodiment, shoulder 70 defines a right angle shoulder formed in second main face 42 having a land 72 projecting normal to lateral sides 44, 46. Land 72 is oriented toward second main face 42. When encapsulation material 30 (FIG. 1) is molded around profiled element 54, shoulder 70 and land 72 combine to minimize movement in at least the −Y axis direction.

Figure 3B:
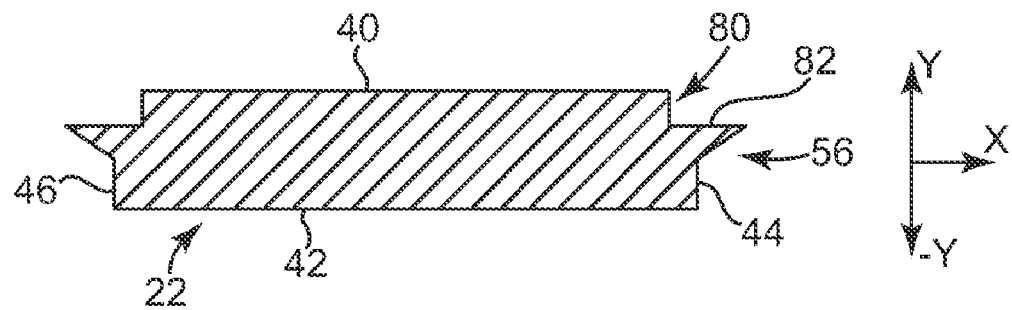
FIG. 3B is a cross-sectional view of the leadframe shown in FIG. 2 taken along line 3B-3B.

FIG. 3B is a cross-sectional view of leadframe 22 taken through line 3B-3B of FIG. 2. In one embodiment, first lateral edge 44 and second lateral edge 46 each include a first profiled element 56 that defines a shoulder 80 formed in first main face 40. In one embodiment, shoulder 80 is a right angle shoulder that defines a land 82 projecting normal to lateral sides 44, 46. In one embodiment, land 82 is oriented toward first main face 40. In one embodiment, when second profiled element 56 is molded with encapsulation material 30 (FIG. 1), shoulder 80 and land 82 combine to minimize movement of leadframe 22 in the +Y axis direction.

Shoulder 70 (FIG. 3A) and shoulder 80 provide right angle shoulders, and first profiled element 54 and second profiled element 56 are illustrated as projecting normal relative to lateral sides 44, 46. It is to be understood that other suitable first profiled elements that are different than second profiled elements are also acceptable and may be formed on the edges of leadframe 22. Embodiments provide at least one edge of leadframe 22 that is structured to include at least one profiled element (i.e., element 54) that is different from at least a second profiled element (i.e., element 56). The different and complementary structure of first and second profiled elements 54, 56 combine to limit movement of leadframe 22 in at least two directions (+Y axis, −Y axis). In one embodiment, the different structure of first and second profiled elements 54, 56 on opposing edged 44, 46 combine to limit movement of leadframe 22 in multi-axis directions along the +Y axis, −Y axis, +X axis, and −X axis.

FIG. 4 is a perspective view of a heatsink 22 or leadframe 22 according to another embodiment in which lateral edge 44 and longitudinal edges 64' and 66' are structured to include profiled sections. In one embodiment, first lateral edge 44 includes first sections 94 structured to include first profiled elements 54, and second sections 96 structured to include second profiled elements 56. In one embodiment, first sections 94 alternate with and are immediately adjacent to second sections 96. As described above, first profiled elements 54 limit movement of leadframe in the −Y axis direction and second profiled elements 56 limit movement of leadframe 22 in the direction of the +Y axis. In addition, alternating first profiled elements 54 with second profiled elements 56 provides a profiled structure for lateral edge 44 that combines to limit movement of leadframe 22 in the −Z axis and the +Z axis directions when covered with encapsulation material 30.

In one embodiment, first sections 94 are structured to include first profiled elements 54 simultaneous with structuring second sections 96 to include second profiled elements 56. In another embodiment, edges 44, 64', and 66' are structured simultaneously to include profiled elements 54 and 56.

FIG. 5 is a perspective view of a process 100 configured to deposit material onto edges of leadframe 22 that are suited for subsequently being formed to include profiled elements in accordance with one embodiment. Process 100 includes a bath 102 of metal ion solution 104 into which leadframe 22 is introduced, an energy source 106 including a cathode clamp 108 coupled to lateral edge 44, and an anode clamp 110 coupled to edge 46. During a galvanic deposition process, leadframe 22 is immersed in metal ion solution 104 and energy source 106 provides a flow of electrons from anode clamp 110 through cathode clamp 108 to galvanically deposit metal material 112 on lateral edge 44 of leadframe 22.

In one embodiment, metal ion solution 104 includes a copper metal ion solution and process 100 galvanically deposits copper material 112 onto lateral edge 44. The copper material 112 is subsequently structured, for example by etching, chemical half-etching, stamping, cold working, etc., to define first profiled elements 54 and second profiled elements 56 (FIG. 4).

Other forms of depositing metal onto edge 44 are also acceptable. In one embodiment, the above-described metal deposition process is conducted in parallel to deposit metal material 112 onto edges 46, 64, and 66 (FIG. 2).

Figure 6:
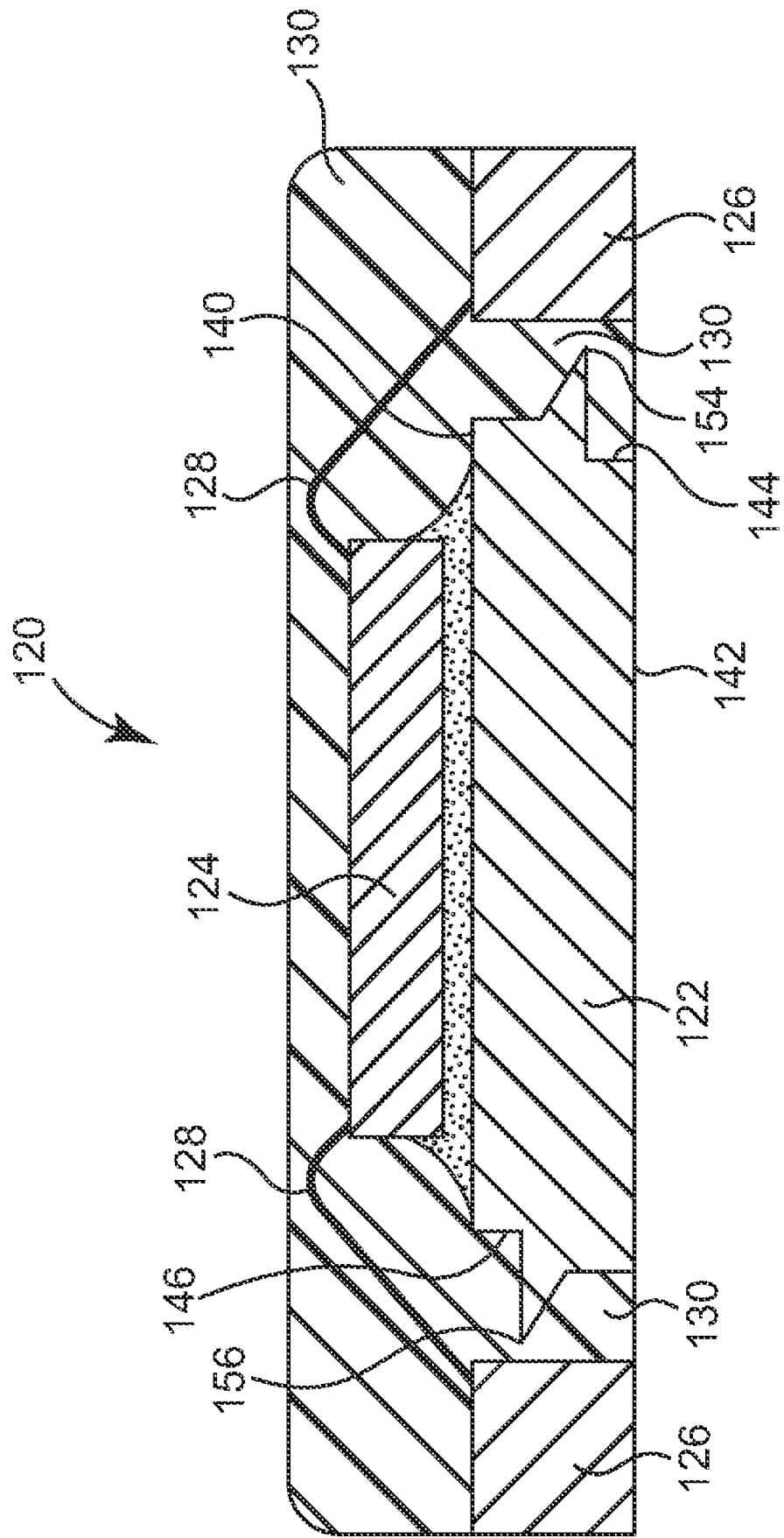
FIG. 6 is a cross-sectional view of an electronic device including a leadframe having a multi-axis mold lock profile according to another embodiment.

FIG. 6 is a cross-sectional view of an electronic device 120 according to another embodiment. Electronic device 120 includes a non-leaded leadframe 22, a chip 124 connected to leadframe 122, connections 126 configured to be electrically connected to chip 124 by connectors 128, and encapsulation material 130 deposited over one surface of leadframe 122, chip 124, and connectors 128.

In one embodiment, chip 124 is similar to chip 24 described above and is connected to leadframe 122 by material 132. In one embodiment, attachment material 132 includes electrically insulating adhesive material, although other forms of material 132 are also acceptable depending upon the electronic application. Connectors 128 are similar to connectors 28 described above, and in one embodiment include gold wires. In one embodiment, encapsulation material 130 is similar to encapsulation material 30 described above and includes epoxy, cross-linked or cross-linkable polymer, plastic, resin, or other electrically insulating material suited for molding and/or covering chip 124.

In one embodiment, leadframe 122 provides a non-leaded leadframe suitable for use in, for example, a very low profile quad flat non-leaded (VQFN) leadframe. In one embodiment, leadframe 122 is both a leadframe and a heatsink.

In one embodiment, leadframe 122 includes a first major surface 140 opposite a second major surface 142, and sides 144, 146 extending between major surfaces 140, 142. Second major surface 142 is exposed relative to encapsulation material 130 and is suited for surface mount connection to other electronic devices, such as printed circuit boards and mother boards. In one embodiment, first side 144 is fabricated to provide a first structure element 154, and second side 146 is fabricated to provide a second structure element 156. Embodiments described below provide side 144 with alternating structure elements 154, 156.

Figure 7:
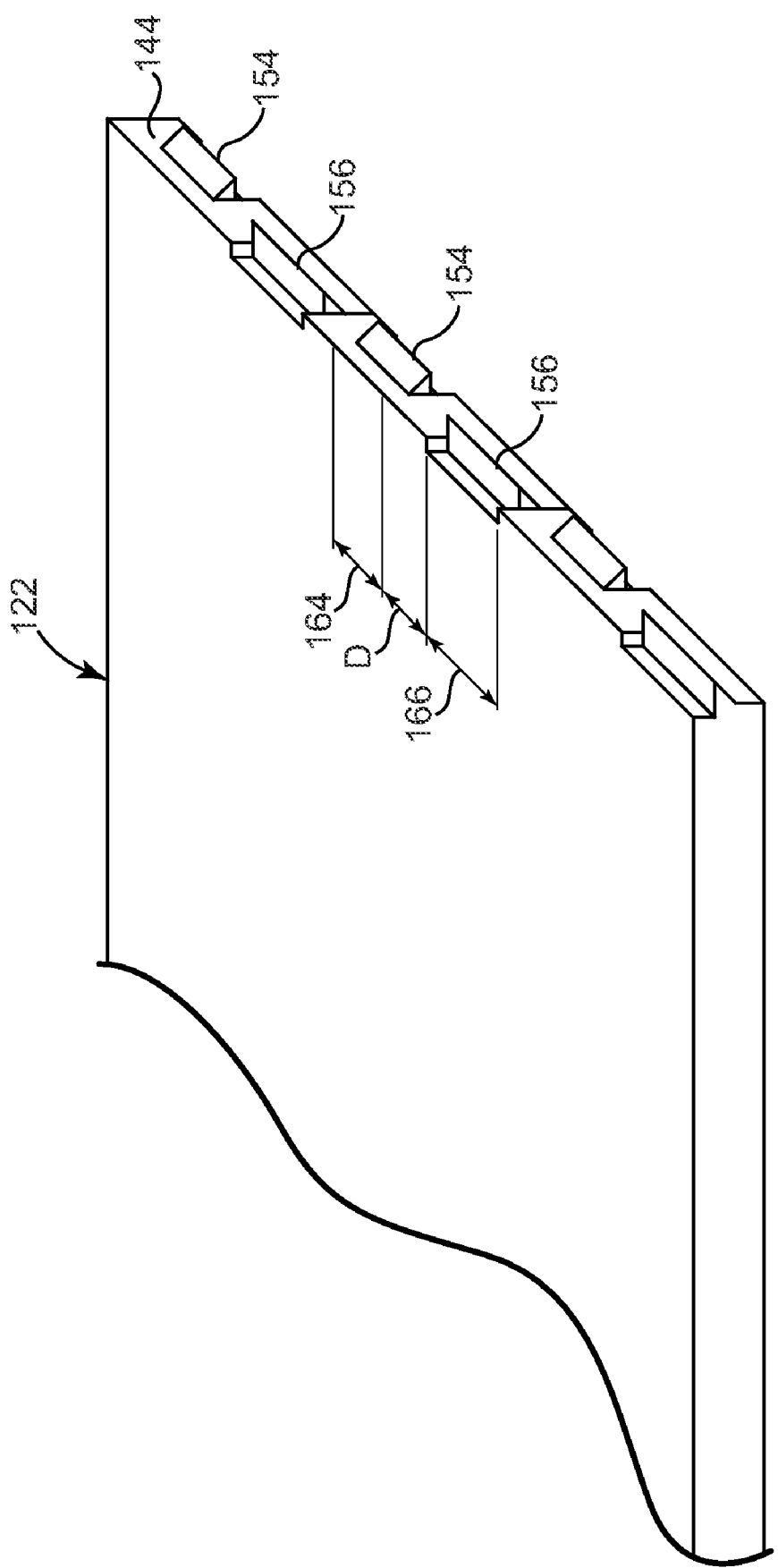
FIG. 7 is a perspective view of the leadframe shown in FIG. 6.

FIG. 7 is a perspective view of leadframe 122 according to one embodiment. First lateral side 144 includes first sections 164 that have been structured to provide first structure elements 154, and second sections 166 that have been structured to provide second structure elements 156. In one embodiment, first section 164 of first structure elements 154 is separated by a distance D from second section 166 of second structured elements 156. In one embodiment, the distance D is between about 1-10 mm depending upon the size of leadframe 122.

In one embodiment, first structure elements 154 and second structure elements 156 alternate along lateral side 144. In one embodiment, lateral side 144 includes at least one first structure element 154 and at least one second structure element 156. Structure elements 154 need not alternate with second structure elements 156.

In one embodiment, first structure elements 154 are fabricated to be different than second structure elements 156 and both structure elements 154, 156 are configured to limit motion of leadframe 122 relative to encapsulation material 130 (FIG. 6). In one embodiment, leadframe 122 provides a multi-axis profiled leadframe configured to minimize lateral movement, longitudinal movement, and vertical movement (i.e., movement along 3 orthogonal axes) of leadframe 122 relative to mold material 130 (FIG. 6).

Embodiments provide a leadframe having at least one edge that is structured to have at least two differently profiled elements, where the profiled elements are configured to minimize movement of the leadframe relative to encapsulation material molded over leadframe. The embodiments of a profiled leadframe described herein provide a leadframe having multi-axis mold locks that provide stronger anchoring between encapsulation material and the leadframe as compared to conventional leadframes. Embodiments provide a leadframe including first and second structure elements that engage with encapsulation material to minimize movement of the leadframe in planes parallel and normal to the leadframe, which resists and minimizes de-lamination of the leadframe/heatsink relative to the encapsulation material.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of a leadframe configured to resist delamination from material molded over the leadframe. Therefore, it is intended that this invention be limited only by the claims and the equivalents thereof.

What is claimed is:

1. An electronic device comprising:
a leadframe having a first main planar face opposite and parallel to a second main planar face, and a plurality of lateral edges extending between the first and second main planar faces, each of the plurality of lateral edges having a height defined between the first and second main planar faces and a length defined between a first end and an opposing second end, at least one of the plurality of edges comprising a first profiled element and a second profiled element different than the first profiled element, the first and second profiled elements each extending the height between the first main planar surface to the second main planar surface, the first profiled element extending along a first sectional length of the length of at least one of the plurality edges and the second profiled element extending along a second sectional length of at least one of the plurality of edges, wherein the second sectional length does not overlap the first sectional length of the length;
a chip attached to the leadframe; and
encapsulation material disposed over the chip and the plurality of edges of the leadframe.

2. The electronic device of claim 1, wherein the leadframe comprises a pair of opposing edges, each of the opposing edges comprising first profiled elements and second profiled elements that have a different configuration than the first profiled elements.

3. The electronic device of claim 2, wherein each of the opposing edges comprises alternating first and second profiled elements.

4. The electronic device of claim 2, wherein the first profiled elements comprise a shoulder that is recessed and parallel relative to the first main face and the second profiled elements comprises a shoulder that is recessed and parallel relative to the second main face, the shoulders configured to engage the encapsulation material and limit motion of the leadframe relative to the encapsulation material.

5. The electronic device of claim 2, wherein the first profiled elements comprise a right angle shoulder that is recessed relative to the first main face and the second profiled elements comprises a right angle shoulder that is recessed relative to the second main face.

6. The electronic device of claim 1, wherein the leadframe comprises four edges, each of the four edges comprising first profiled elements and second profiled elements that have a different configuration than the first profiled elements.

7. A semiconductor package comprising:
a leadframe including an island defining a first major planar surface opposite and parallel to a second major planar surface, and peripheral lateral sides extending between the first and second major surfaces;
a chip attached to the island; and
encapsulation material disposed over at least one of the major surfaces and the peripheral lateral sides;
wherein at least two of the peripheral lateral sides of the island each comprise a first profiled section having a height defined by the distance between the first major planar surface to the second major planar surface and a different second profiled section having the height defined by the distance between the first major planar surface to the second major planar surface, the first profiled section having a different profile configuration than the second profiled section, the first profiled section extending along a first length of the peripheral lateral sides and the second profiled section extending along a second length of the peripheral lateral sides, the first length not overlapping the second length, the first and second profiled sections engaged with the encapsulation material and minimizing movement of the leadframe relative to the encapsulation material.

8. The semiconductor package of claim 7, wherein the first profiled section comprises a first corner recessed from the first major surface and the second profiled section comprises a second corner recessed from the second major surface.

9. The semiconductor package of claim 8, wherein the first corner and the second corner each comprise a right angle corner.

10. The semiconductor package of claim 7, wherein the peripheral sides of the island comprises opposing parallel lateral sides of the island.

11. The semiconductor package of claim 7, wherein the peripheral sides of the island each comprise alternating first and second profiled sections.

12. The semiconductor package of claim 11, wherein the first profiled sections are spaced apart from the second profiled sections.

13. The semiconductor package of claim 7, wherein the alternating first and second profiled sections each comprise a pointed projection extending from the peripheral sides of the island.

14. A semiconductor device comprising:
a leadframe including an island comprising:
a first major planar surface opposite and parallel to a second main planar surface disposed within a perimeter of the island,
sides disposed at the perimeter of the island, a first side having a height extending from the first major planar surface to the second major planar surface and defining a first section of first structure elements projecting from the first side of the island and a second section of second structure elements projecting from the first side of the island, wherein the first structure elements are configured with a different profile than the second structure elements, and wherein the first section and the second section each extend the height of the first side and are disposed at different lengths along the first side of the island;
a chip attached to the first major surface of the island; and
encapsulation material disposed over the chip and the sides of the island;
wherein the first and second structure elements engage with the encapsulation material and minimize movement of the leadframe relative to the encapsulation material.

15. The semiconductor device of claim 14, wherein the sides of the island comprise opposing lateral sides comprising a first section of first structure elements projecting from the opposing lateral sides and a second section of second structure elements projecting from the opposing lateral sides of the island.

16. The semiconductor device of claim 15, wherein the first section of first structure elements alternates along the opposing lateral sides with the second section of second structure elements.

17. The semiconductor device of claim 16, wherein the leadframe comprises a second major surface opposite the first major surface such that the semiconductor device defines a package top adjacent to the first major surface and a package bottom adjacent to the second major surface, and further wherein the first and second structure elements engage with the encapsulation material to minimize movement of the leadframe toward the package top and the package bottom.

18. The semiconductor device of claim 17, wherein the first and second structure elements engage with the encapsulation material to minimize movement of the leadframe in a plane parallel to the package top and the package bottom.

* * * * *